(12) United States Patent
Kato et al.

(10) Patent No.: US 11,933,837 B2
(45) Date of Patent: Mar. 19, 2024

(54) INSPECTION JIG, AND INSPECTION DEVICE

(71) Applicant: NIDEC READ CORPORATION, Kyoto (JP)

(72) Inventors: Minoru Kato, Kyoto (JP); Makoto Fujino, Kyoto (JP)

(73) Assignee: NIDEC READ CORPORATION, Kyoto (JP)

( * ) Notice: Subject to any disclaimer, the term of this patent is extended or adjusted under 35 U.S.C. 154(b) by 77 days.

(21) Appl. No.: 17/601,086

(22) PCT Filed: Mar. 27, 2020

(86) PCT No.: PCT/JP2020/014217
§ 371 (c)(1),
(2) Date: Oct. 4, 2021

(87) PCT Pub. No.: WO2020/203848
PCT Pub. Date: Oct. 8, 2020

(65) Prior Publication Data
US 2022/0178987 A1    Jun. 9, 2022

(30) Foreign Application Priority Data

Apr. 5, 2019 (JP) .................................. 2019-073138

(51) Int. Cl.
| | |
|---|---|
| *G01R 31/00* | (2006.01) |
| *G01R 1/02* | (2006.01) |
| *G01R 1/04* | (2006.01) |
| *G01R 1/067* | (2006.01) |
| *G01R 1/073* | (2006.01) |

(Continued)

(52) U.S. Cl.
CPC ..... *G01R 31/2808* (2013.01); *G01R 1/06722* (2013.01); *G01R 1/073* (2013.01); *G01R 31/2601* (2013.01)

(58) Field of Classification Search
CPC ........ G01R 31/00; G01R 31/02; G01R 31/06; G01R 31/28; G01R 1/02; G01R 1/04; G01R 1/067; G01R 1/073
See application file for complete search history.

(56) References Cited

U.S. PATENT DOCUMENTS

| | | | | |
|---|---|---|---|---|
| 4,523,144 A | * | 6/1985 | Okubo | ............... G01R 1/07342 324/750.25 |
| 2005/0095734 A1 | | 5/2005 | Hasebe et al. | |
| 2014/0340103 A1 | | 11/2014 | Kasai et al. | |

(Continued)

FOREIGN PATENT DOCUMENTS

| | | |
|---|---|---|
| CN | 109490588 A | 3/2019 |
| JP | S58148935 U | 10/1983 |

(Continued)

*Primary Examiner* — Neel D Shah
(74) *Attorney, Agent, or Firm* — VIERING, JENTSCHURA & PARTNER mbB

(57) ABSTRACT

In various examples, an inspection jig includes a plate-shaped insulating member having a recess; a first board having a first electrode; and a conducting wire electrically connected to a contact terminal. The insulating member is provided with a through hole penetrating a bottom portion of the recess. One end portion of the conducting wire is disposed in the through hole. The other end of the conducting wire is connected to the first electrode.

20 Claims, 7 Drawing Sheets

(51) Int. Cl.
*G01R 31/28* (2006.01)
*G01R 31/26* (2020.01)

(56) References Cited

U.S. PATENT DOCUMENTS

2014/0368229 A1     12/2014   Arai et al.
2019/0170817 A1*    6/2019    Uebayashi ......... G01R 1/07357

FOREIGN PATENT DOCUMENTS

| JP | 03209738   A | 9/1991 |
| JP | 08105915   A | 4/1996 |
| JP | 2004003911 A | 1/2004 |

* cited by examiner

INSPECTION JIG, AND INSPECTION DEVICE

CROSS-REFERENCE TO RELATED APPLICATIONS

This is a U.S. National Stage Application, filed under 35 U.S.C. § 371, of International Application No. PCT/JP2020/014217, filed on Mar. 27, 2020, and claims priority under 35 U.S.C. § 119(a) and 35 U.S.C. § 365(b) from Japanese Patent Application No. 2019-073138, filed on Apr. 5, 2019; the disclosures of which are incorporated herein by reference.

FIELD

Various embodiments relate to an inspection jig for inspecting an inspection target.

BACKGROUND

An example of a conventional probe card device is known.

The conventional probe card device functions as an interface between a tester for controlling the test of a DUT and the electronic device. The probe card device includes a main subassembly and a probe head.

The main subassembly includes a wiring structure and a probe-head interface. The wiring structure is a printed circuit board or the like. The probe-head interface includes an electrical terminal on one side, an electrical contact on the other side, and an electrical connection from the electrical terminal to the electrical contact. The wiring structure is connected to the electrical terminal by a wire.

The probe head includes a probe insertion portion. The probe insertion portion includes a connector on one side of the probe head and a probe extending from the other side of the probe head. The electrical connection connects the connector to the probe. The number and pattern of connectors correspond to the number and pattern of electrical contacts of the probe-head interface. Thus, the connector is electrically connected to the electrical contact. The number and pattern of probes correspond to the number and pattern of terminals of the DUT to be tested.

The conventional probe head electrically connects the probe corresponding to the pattern of the terminal of the DUT and the connector corresponding to the pattern of the electrical contact of the probe head interface. Therefore, it is considered that it is difficult to start manufacturing unless the pattern of the terminal of the DUT is determined.

The probe head electrically connects the probe disposed at the position corresponding to the terminal of the DUT and the connector disposed at the position corresponding to the electrical contact of the probe head interface. Therefore, it is considered that a predetermined manufacturing period is required for manufacturing the probe head.

Therefore, it is estimated that the manufacturing period of the probe card device becomes long.

SUMMARY

An exemplary inspection jig of the present disclosure includes: a plate-shaped insulating member having a recess; a first board having a first electrode; and a conducting wire electrically connected to a contact terminal. The insulating member is provided with a through hole penetrating a bottom portion of the recess. One end portion of the conducting wire is disposed in the through hole. The other end of the conducting wire is connected to the first electrode.

The above and other elements, features, steps, characteristics and advantages of the present disclosure will become more apparent from the following detailed description of the various embodiments with reference to the attached drawings.

BRIEF DESCRIPTION OF THE DRAWINGS

In the drawings, like reference characters generally refer to the same parts throughout the different views. In the drawings, components given the same reference numerals denote the same components, and description thereof will be omitted. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
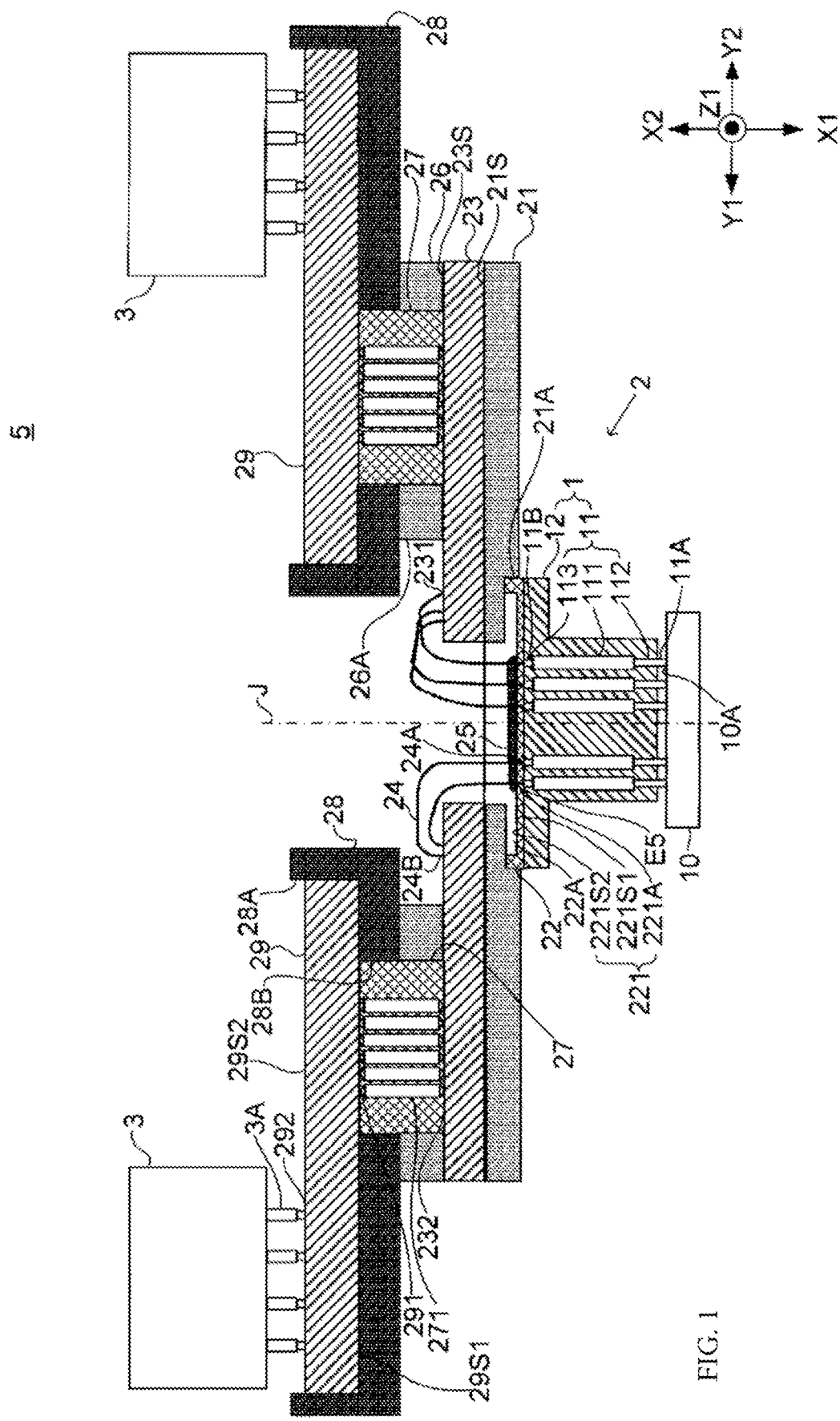
FIG. 1 is a schematic longitudinal sectional view of an inspection device according to an embodiment of the present disclosure.

Hereinafter, exemplary embodiments of the present disclosure will be described with reference to the drawings. Note that an insulating member 22 described later has a plate shape, and in the drawings, a thickness direction of the insulating member 22 is indicated as an X direction, one side in the X direction is indicated as X1, and the other side in the X direction is indicated as X2. A direction perpendicular to the X direction is defined as a Y direction, one side in the Y direction is defined as Y1, and the other side in the Y direction is defined as Y2. A direction perpendicular to the X direction and the Y direction is defined as a Z direction, one side in the Z direction is defined as Z1, and the other side in the Z direction is defined as Z2. Further, a direction around a center axis J (FIGS. 1 and 2) extending in the X direction of the insulating member 22 is referred to as a "circumferential direction". The radial direction with respect to the center axis J is referred to as a "radial direction".

Here, an overall configuration of an inspection device according to an embodiment of the present disclosure will be described with reference to FIGS. 1 to 4. As illustrated in FIG. 1, an inspection device 5 according to an embodiment of the present disclosure electrically inspects an inspection target 10. In FIG. 1, one side X1 is a lower side, and the other side X2 is an upper side. In addition, one side Y1 is the left side of the paper, and the other side Y2 is the right side of the paper. In addition, one side Z1 is the front side of the paper, and the other side Z2 is the back side of the paper.

The inspection target 10 is, for example, a semiconductor wafer in which a plurality of circuits is formed on a semiconductor board such as silicon. The semiconductor wafer is diced to be divided into semiconductor chips having the individual circuits. In addition to the semiconductor wafer, the inspection target 10 may be, for example, a semiconductor chip, a chip size package (CSP), or an electronic component such as a semiconductor element.

In addition, the inspection target 10 may be a board. In this case, the inspection target 10 may be, for example, a board such as a printed circuit board, a glass epoxy board, a flexible board, a ceramic multilayer circuit board, a package board for a semiconductor package, an intermediate member board, or a film carrier. The inspection target 10 may alternatively be an electrode plate for a display such as a liquid crystal display, an electro-luminescence (EL) display, or a touch screen display or an electrode plate for a touch screen.

The inspection target 10 may alternatively be a product obtained by packaging technology called embedded multi-die interconnect bridge (EMIB). According to EMIB, a small silicon substrate called a silicon bridge is embedded in a package resin board, and fine wires are formed on a surface of the silicon bridge in high density, so that adjacent silicon dies are mounted on the package resin board in proximity to each other.

The inspection device 5 includes an inspection jig 2 and an inspection processing portion (scanner) 3. In the present embodiment, as an example, the number of inspection processing portions 3 is six. However, the number of inspection processing portions 3 may be a plurality other than six, or may be a single.

The inspection jig 2 includes a probe head 1. The probe head 1 includes a plurality of contact terminals 11 and a support member 12. That is, the inspection jig 2 includes the contact terminal 11.

The contact terminal 11 is formed in a rod shape extending in the vertical direction. In the present embodiment, as an example, the contact terminal 11 includes a tubular body 111, a first conductor (plunger) 112, and a second conductor (plunger) 113. The tubular body 111 has a cylindrical shape, and is formed of, for example, a nickel or nickel-alloy tube having an outer diameter of about 25 to 300 μm and an inner diameter of about 10 to 250 μm. Preferably, the tubular body 111 has, on its inner peripheral surface, a conductive layer such as a gold plating layer. In addition, the tubular body 111 may have an outer peripheral surface coated with an insulation coating as necessary.

The first conductor 112 and the second conductor 113 are formed of, for example, a conductive material such as a palladium alloy. The first conductor 112 is inserted into the tubular body 111 from the one side X1, and the one side X1 end portion of the insertion portion is fixed to the tubular body 111 by press fitting or the like. In a state where the first conductor 112 is fixed to the tubular body 111, a part of the first conductor 112 is a protruding portion protruding from the tubular body 111 toward the one side X1. The one end of the protruding portion is a one end portion 11A of the contact terminal 11. The one end portion 11A can contact an inspection point 10A of the inspection target 10.

The second conductor 113 is inserted into the tubular body 111 from the other side X2, and the other side X2 end portion of the insertion portion is fixed to the tubular body 111 by press fitting or the like. In a state where the second conductor 113 is fixed to the tubular body 111, a part of the second conductor 113 is a protruding portion protruding from the tubular body 111 to the other side X2. The other side end portion of the protruding portion is the other side end portion 11B of the contact terminal 11.

The tubular body 111 has a spring portion in the middle in the vertical direction. As a result, the tubular body 111 can expand and contract in the vertical direction. In addition, a conduction path is formed through the first conductor 112, the tubular body 111, and the second conductor 113.

The support member 12 supports the plurality of contact terminals 11. More specifically, for example, a through hole penetrating in the vertical direction is formed in the support member 12, and the contact terminal 11 is accommodated in the through hole. In this case, due to the dimensional relationship between the contact terminal 11 and the through hole, when the contact terminal 11 is inserted into the through hole, the contact terminal 11 is prevented from falling off to the one side X1.

In addition to the probe head 1, the inspection jig 2 includes a first accommodating member 21, an insulating member 22, a first board 23, a plurality of conducting wires 24, a fixing portion 25, a second accommodating member 26, an intermediate member 27, a third accommodating member 28, and a second board 29.

Figure 3:
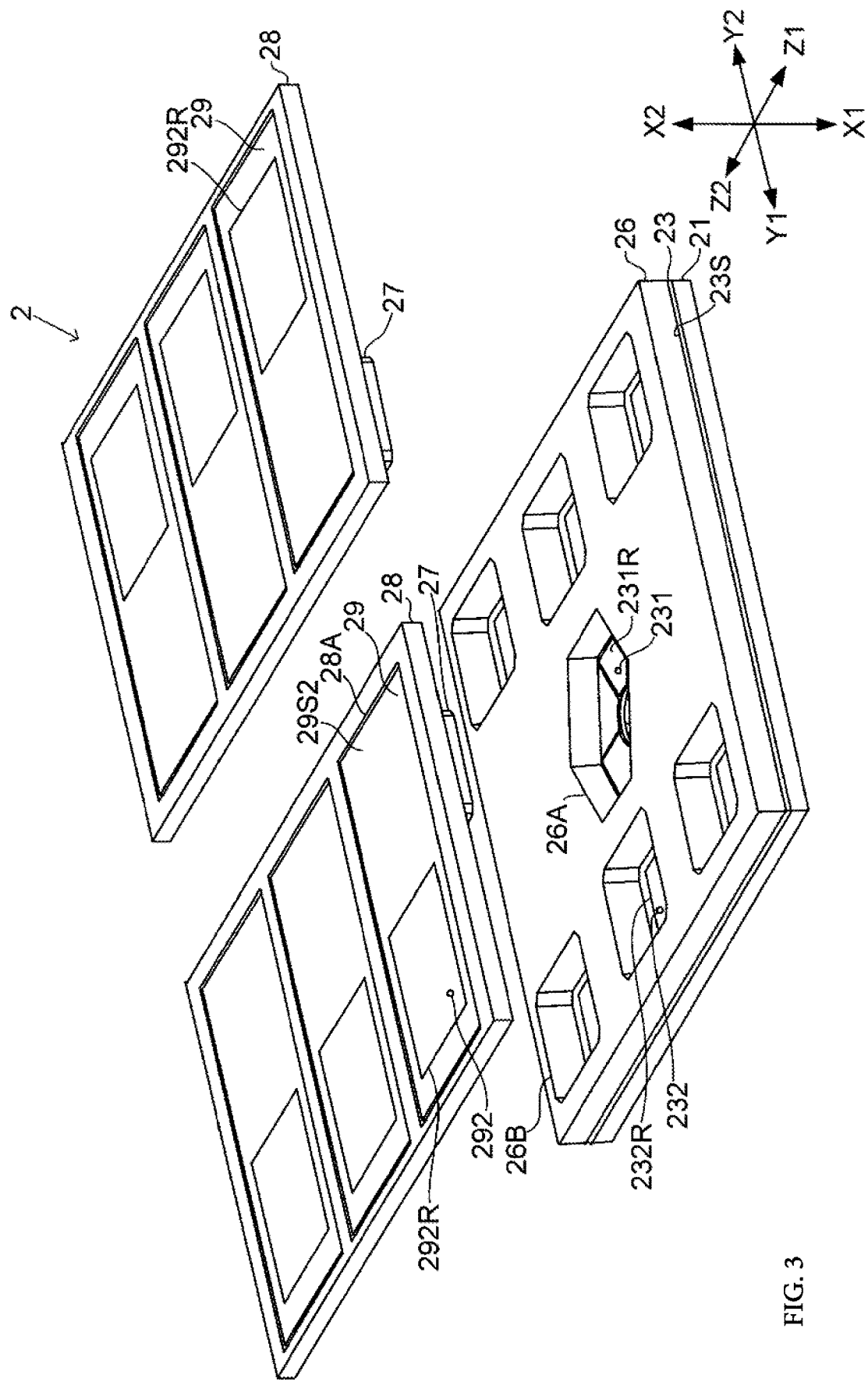
FIG. 3 is an exploded perspective view of the inspection jig according to the embodiment of the present disclosure as viewed from above.

As illustrated in FIG. 3, the first accommodating member 21 has a plate shape having a quadrangular outer shape as viewed in the vertical direction, and is formed of, for example, metal containing aluminum. The first accommodating member 21 has a first accommodating portion 21A recessed toward the other side X2. The insulating member 22 is accommodated in the first accommodating portion 21A.

The insulating member 22 is a plate-like member having a recess 22A recessed toward the one side X1, and is formed of an insulating material. The insulating member 22 is formed of, for example, ceramic as an insulating material, resin, or the like. As an example of the resin, SUMIKASPER (registered trademark) can be used.

That is, the inspection jig 2 includes the plate-shaped insulating member 22 having the recess 22A.

The insulating member 22 is provided with a through hole 221A penetrating a bottom portion 221 of the recess 22A. A plurality of through holes 221A are provided, and are formed in accordance with the positions of contact terminals 11, for example.

One end portion 24A of the conducting wire 24 is inserted into the through hole 221A. The conducting wire 24 is formed of, for example, an enameled wire. The enameled wire is formed by covering a copper wire with an insulating film. That is, the conducting wire 24 has an insulating film. As a result, even when the pitch between the through holes 221A is narrow and the conducting wires 24 easily come into contact with each other, it is possible to suppress short-circuiting of the conducting wires 24.

A fifth electrode E5 is formed including the end surface of the one end portion 24A of the conducting wire 24. The fifth electrode E5 is formed on one side surface 221S1 of the bottom portion 221. The support member 12 is fixed to the one side surface 221S1 of the bottom portion 221 while the other side end portion of the second conductor 113, that is, the other side end portion 11B of the contact terminal 11 is in contact with the fifth electrode E5. In this state, the probe head 1 is disposed on the one side X1 of the insulating member 22. As a result, the spring portion of the tubular body 111 is compressed in the vertical direction, and the other side end portion 11B is pressed against the fifth electrode E5 by the elastic force of the spring portion. Accordingly, the conduction state between the contact terminal 11 and the fifth electrode E5 is stabilized. That is, the inspection jig 2 includes the conducting wire 24 electrically connected to the contact terminal 11.

In this manner, the one end portion 24A of one conducting wire 24 is inserted into one through hole 221A, and one contact terminal 11 is electrically connected to the one conducting wire 24. That is, the number of the through holes 221A is the same as the number of the conducting wires 24 and the number of the contact terminals 11.

Figure 2:
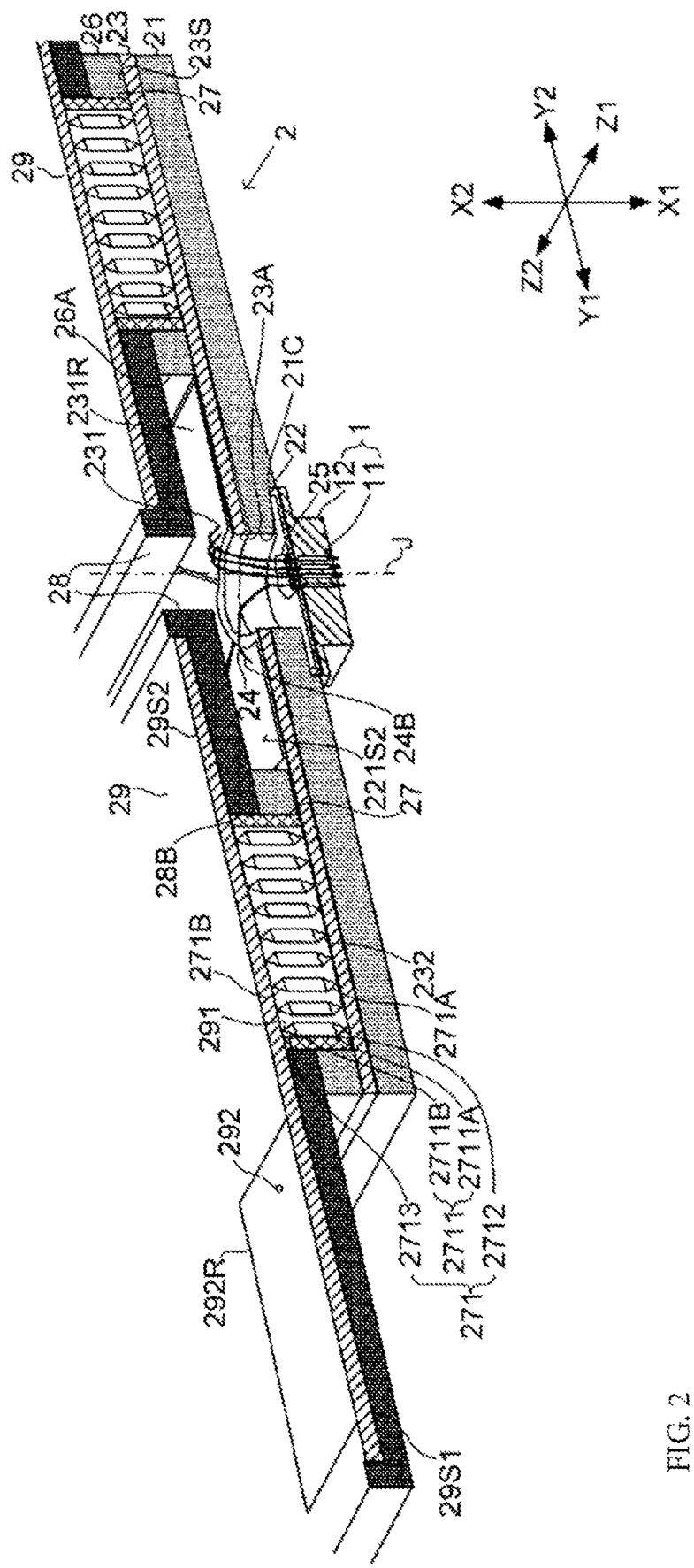
FIG. 2 is a schematic partial longitudinal sectional perspective view of an inspection jig according to an embodiment of the present disclosure.

The first board 23 is disposed on the other side surface 21S of the first accommodating member 21. The first board 23 is disposed on the other side X2 of the insulating member 22. As illustrated in FIG. 3, the first board 23 has a quadrangular outer shape as viewed in the vertical direction, for example. As illustrated in FIG. 2, the first board 23 has a board through hole 23A penetrating in the vertical direction at the central position. That is, the first board 23 has the board through hole 23A penetrating in the thickness direction of the insulating member 22.

As illustrated in FIG. 2, on the other side surface 23S of the first board 23, a plurality of first electrode regions 231R in which a plurality of first electrodes 231 are arranged are arranged in the circumferential direction around the board through hole 23A. In FIG. 3, one first electrode 231 in the first electrode region 231R is representatively illustrated, and the same applies to a second electrode 232 and a fourth electrode 292. That is, the inspection jig 2 includes the first board 23 having the first electrode 231. The first electrode region 231R is formed in a shape obtained by removing a fan shape from a triangle. The group of the first electrodes 231 arranged in each of the first electrode regions 231R is electrically connected to each of the plurality of inspection processing portions 3 (see FIG. 1) provided. In the present embodiment, since the number of inspection processing portions 3 is six, the number of first electrode regions 231R is also six.

As illustrated in FIG. 2, the first accommodating member 21 has a through hole 21C penetrating in the vertical direction at the central position. The board through hole 23A is connected to the other side X2 of the through hole 21C. The conducting wire 24 is drawn out from the other side surface 221S2 of the bottom portion 221 to the other side X2, and is connected to the first electrode 231 through the through hole 21C and the board through hole 23A. That is, the other end portion 24B of the conducting wire 24 is connected to the first electrode 231. As a result, the contact terminal 11 is electrically connected to the first electrode 231 via the conducting wire 24. In other words, the conducting wire 24 is disposed in the board through hole 23A. The conducting wire 24 extends radially inward from the first electrode 231 to the board through hole 23A in plan view as viewed from the one side X1. As a result, it is possible to narrow the pitch of the contact terminals 11 electrically connected to the conducting wire 24 and to cope with narrowing the pitch of the inspection points 10A of the inspection target 10.

Here, as illustrated in FIGS. 1 and 2, the first board 23 has a portion which is disposed on the recess 22A side of the insulating member 22, and overlaps the insulating member 22 when viewed in the thickness direction of the insulating member 22. In plan view in the X direction (the thickness direction) in the case of such a configuration, the distance between the position of the through hole 221A and the position of the first electrode 231 is shorter than that in a case where the first board 23 does not overlap the insulating member 22. Therefore, the length of the conducting wire 24 can be shortened, and the electric resistance value of the conduction path can be reduced.

Here, the number of first electrodes 231 in the first board 23 is larger than the number of conducting wires 24. That is, there is the first electrode 231 to which the other end portion 24B is not connected. Consequently, even if the kind of the inspection target 10 and the kind of the probe head 1 are switched, the first board 23 can be made common, and the manufacturing period of the inspection jig 2 can be shortened.

The other end portion 24B of the conducting wire 24 is not limited to be connected to some of the first electrodes 231 in the first board 23 as described above, and may be connected to all of the first electrodes 231 in the first board 23. That is, the other end portion 24B of the conducting wire 24 is connected to the first electrode 231.

A part of the fixing portion 25 is placed on the other side surface 221S2 of the bottom portion 221 and accommodated in the recess 22A. The fixing portion 25 is a mold portion formed of a curable resin as described later, and has a function of fixing a part of the conducting wire 24 to the insulating member 22.

A method of manufacturing the configuration including the insulating member 22, the first board 23, the conducting wire 24, the fixing portion 25, and the fifth electrode E5 will be described later.

As illustrated in FIG. 3, on the other side surface 23S of the first board 23, three second electrode regions 232R in which the plurality of second electrodes 232 are arranged are arranged side by side in the Z direction on one side Y1 in the Y direction and the other side Y2 in the Y direction of the first electrode region 231R. The group of the second electrodes 232 arranged in each of the second electrode regions 232R is electrically connected to each of the plurality of inspection processing portions 3 (see FIG. 1) provided. In FIG. 3, since the number of inspection processing portions 3 is six, the number of second electrode regions 232R is also six. The second electrode 232 is electrically connected to the first electrode 231 by wiring (not illustrated) disposed inside a board portion 230 (see FIG. 7) of the first board 23.

That is, the first board 23 includes the second electrode 232 electrically connected to the first electrode 231 and disposed on the other side surface 23S of the first board 23. Accordingly, it is possible to facilitate electrical connection between the inspection processing portion 3 disposed on the other side X2 of the first board 23 and the first board 23.

As illustrated in FIG. 3, the second accommodating member 26 has a plate shape having a quadrangular outer shape as viewed in the vertical direction, and is formed of, for example, metal containing aluminum. The second accommodating member 26 has a hole portion 26A penetrating in the thickness direction at a central position. The first electrode region 231R is exposed upward through the hole portion 26A when viewed from above. Accordingly, the conducting wire 24 can be disposed inside the hole portion 26A.

The second accommodating member 26 has three second accommodating portions 26B arranged in the Z direction on each of one side Y1 in the Y direction and the other side Y2 in the Y direction. The second accommodating portion 26B is a hole portion penetrating in the thickness direction (X direction). The second electrode region 232R is exposed upward through the second accommodating portion 26B when viewed from above.

Figure 4:
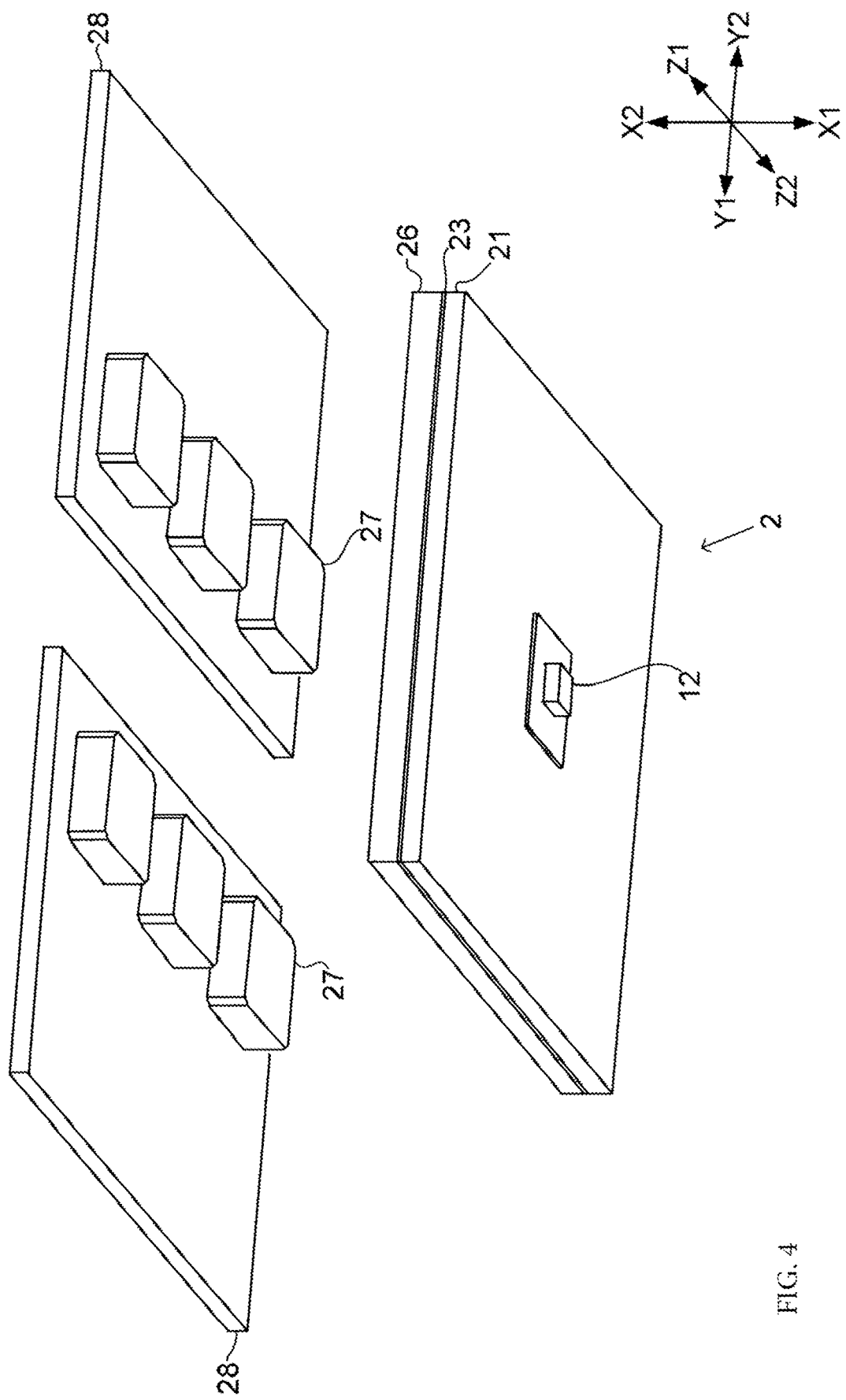
FIG. 4 is an exploded perspective view of the inspection jig according to the embodiment of the present disclosure as viewed from below.

As illustrated in FIG. 4, a part of the intermediate member 27 protrudes from the third accommodating member 28 to the one side X1, and has a substantially quadrangular outer diameter as an example when viewed in the vertical direction.

As illustrated in FIGS. 1 and 2, the intermediate member 27 includes a connection member 271. The connection member 271 includes, for example, a spring member 2711 that can expand and contract in the vertical direction, a first plunger 2712, and a second plunger 2713. The first plunger 2712 is fixed to the one side end portion 2711A of the spring member 2711. The second plunger 2713 is fixed to the other side end portion 2711B of the spring member 2711. The spring member 2711, the first plunger 2712, and the second plunger 2713 are formed of a conductive material.

Two third accommodating members 28 are arranged side by side in the Y direction. Each of the third accommodating members 28 has a recess 28A recessed toward the one side X1, and is formed of, for example, metal containing aluminum. Three recesses 28A are arranged side by side in the Z direction. Each of the second boards 29 is accommodated in each of the recesses 28A. That is, six second boards 29 are provided. The third accommodating member 28 has a through hole 28B connected to the one side X1 of the recess 28A.

A third electrode 291 is formed on one side surface 29S1 of the second board 29. The intermediate member 27 is fixed to the third accommodating member 28 while bringing the second plunger 2713 into contact with the third electrode 291 in the through hole 28B. As a result, the spring member 2711 is compressed in the vertical direction, and the second plunger 2713 is pressed against the third electrode 291 by the elastic force of the spring member 2711. Therefore, the conduction state between the second plunger 2713 and the third electrode 291 is stabilized.

Then, each intermediate member 27 is inserted into each second accommodating portion 26B, and the third accommodating member 28 is fixed to the second accommodating member 26 while the first plunger 2712 is brought into contact with the second electrode 232. As a result, the spring member 2711 is compressed in the vertical direction, and the first plunger 2712 is pressed against the second electrode 232 by the elastic force of the spring member 2711. Therefore, the conduction state between the first plunger 2712 and the second electrode 232 is stabilized.

As illustrated in FIG. 3, on the other side surface 29S2 of each second board 29, a fourth electrode region 292R in which the plurality of fourth electrodes 292 are disposed is disposed. In each of the boards 29 on the one side Y1 in the Y direction, the fourth electrode region 292R is disposed on the one side Y1 in the Y direction. In each of the boards 29 on the other side Y2 in the Y direction, the fourth electrode region 292R is disposed on the other side Y2 in the Y direction.

The group of the fourth electrodes 292 arranged in each of the fourth electrode regions 292R is electrically connected to each of the plurality of inspection processing portions 3 (see FIG. 1) provided. In FIG. 3, since the number of inspection processing portions 3 is six, the number of fourth electrode regions 292R is also six. The fourth electrode 292 is in contact with a terminal 3A (see FIG. 1) of the inspection processing portion 3.

The third electrode 291 and the fourth electrode 292 are electrically connected by wiring inside the board portion of the second board 29. The pitch between the fourth electrodes 292 is determined by the pitch between the terminals 3A of the inspection processing portion 3, and is wider than the pitch between the third electrodes 291.

That is, the inspection jig 2 includes the connection member 271 extending in the thickness direction of the insulating member 22 and the second board 29. The third electrode 291 is disposed on the one side surface 29S1 of the second board 29. The fourth electrode 292 is disposed on the other side surface 29S2 of the second board 29. The third electrode 291 and the fourth electrode 292 are electrically connected. The pitch between the fourth electrodes 292 is wider than the pitch between the third electrodes 291. The one side end portion 271A of the connection member 271 is in contact with the second electrode 232. The other side end portion 271B of the connection member 271 is in contact with the third electrode 291.

As a result, the pitch between the second electrodes 232 can be converted into the pitch between the fourth electrodes 292 for connection with the inspection processing portion 3. In addition, the connection member 271 includes a spring portion 2711 that can be compressed in the thickness direction. As a result, the conduction state between the second electrode 232 and the third electrode 291 can be stabilized.

With the above configuration, the contact terminal 11 is electrically connected to the inspection processing portion 3 via the fifth electrode E5, the conducting wire 24, the first electrode 231, the second electrode 232, the connection member 271, the third electrode 291, and the fourth electrode 292.

At the time of inspection of the inspection target 10, as illustrated in FIG. 1, the one end portion 11A of the contact terminal 11 is brought into contact with the inspection point 10A of the inspection target 10. At this time, since the spring portion of the tubular body 111 is compressed in the vertical direction, the one end portion 11A is pressed against the inspection point 10A by the elastic force of the spring portion. As a result, the conduction state between the one end portion 11A and the inspection point 10A is stabilized.

At the time of inspection of the inspection target 10, the inspection point 10A and the inspection processing portion 3 are electrically connected. The inspection processing portion 3 sequentially outputs the inspection signals to the inspection point 10A via the contact terminal 11, and acquires the inspection signals from the inspection point 10A accordingly. Based on these inspection signals, the inspection processing portion 3 detects the presence or absence of conduction between the inspection points 10A, and the inspection processing portion 3 inspects the presence or absence of disconnection or short circuit in the inspection target 10.

In the case that the contact terminal 11 is electrically connected directly to the electrode of the second board 29 through the conducting wire 24, the second board 29 needs to be replaced every time the specification of the inspection target 10 is changed. On the other hand, in the present embodiment, even if the specification of the inspection target 10 is changed, the portion including the probe head 1, the first accommodating member 21, the insulating member 22, the first board 23, the conducting wire 24, the fixing member 25, and the second accommodating member 26 may be replaced, and the portion including the intermediate member 27, the third accommodating member 28, and the second board 29 does not need to be replaced. Therefore, the six second boards 29 having the large size can be shared, and the first board 23 having the small size can be replaced, so that the running cost can be reduced. In particular, since the pitch between the third electrodes 291 is narrower than the pitch between the fourth electrodes 292, the pitch between the connection members 271 and the pitch between the second electrodes 232 can be narrowed, the size of the first board 23 can be made smaller than the size of the six second boards 28, and the running cost can be reduced.

The contact terminal 11 may be a wire-shaped inspection contact having bendable elasticity. The contact terminal 11 is supported by the support member 12 in a posture inclined from the vertical direction. Then, by bringing the inspection point 10A into contact with the one end portion 11A of the contact terminal 11, the contact terminal 11 is bent. The bending direction can be determined by inclining and supporting the contact terminal 11. By using the wire-shaped contact for inspection as described above, it is possible to cope with the inspection of the inspection target 10 that is highly integrated.

Next, a manufacturing process of a configuration for electrically connecting the contact terminal 11 and the first board 23 in the inspection jig 2 will be described with reference to FIGS. 5 to 11.

Note that the steps in FIGS. 5 to 11 are performed in a state where the insulating member 22 and the first board 23 are accommodated in the first accommodating member 21. That is, the inspection jig 2 includes an accommodating member 21 having the first accommodating portion 21A that is recessed and accommodates the insulating member 22. As a result, the insulating member 22 for connecting the conducting wire 24 and the first electrode 231 can be easily positioned as described later.

Figure 5:
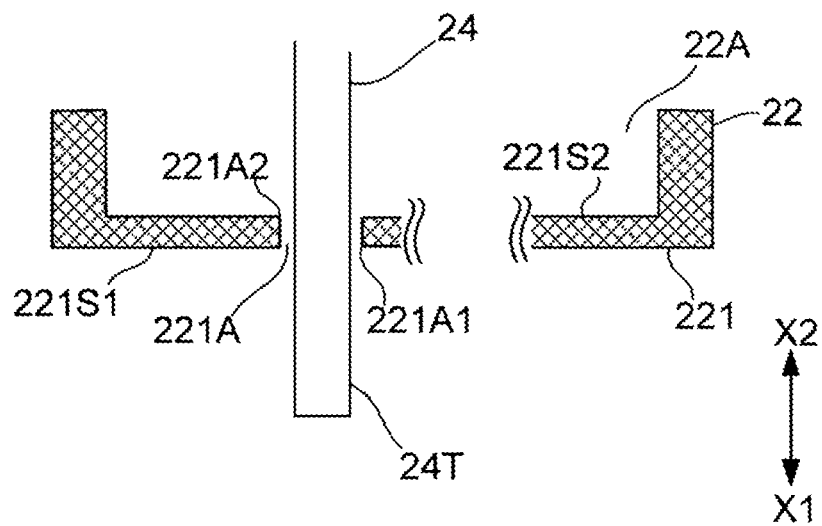
FIG. 5 is a view illustrating a step of inserting a conducting wire into a through hole of an insulating member.

First, the type of the probe head 1 is switched, and an arrangement position of contact terminals 11 is changed for each type. When the type of the probe head 1 is determined, the through hole 221A is formed at a position corresponding to the arrangement of the contact terminal 11 on the bottom portion 221 of the insulating member 22. The through holes 221A may be formed in a matrix shape, and the through holes 221A at positions corresponding to the position of the contact terminal 11 may be used. That is, the number of through holes 221A is larger than the number of contact terminals 11. As a result, the insulating member 22 having the matrix-shaped through hole 221A can be prepared in advance, and it is not necessary to manufacture the insulating member 22 after the type of the probe head 1 is determined. In addition, since the thickness of the bottom portion 221 is thin, it is easy to form the through hole 221A. Here, as illustrated in FIG. 5, the through hole 221A has an opening portion 221A1 on the one side surface 221S1 of the bottom portion 221 and an opening portion 221A2 on the other side surface 221S2 of the bottom portion 221. Then, as illustrated in FIG. 5, the conducting wire 24 is inserted into the through hole 221A from the opening portion 221A2 side.

Figure 6:
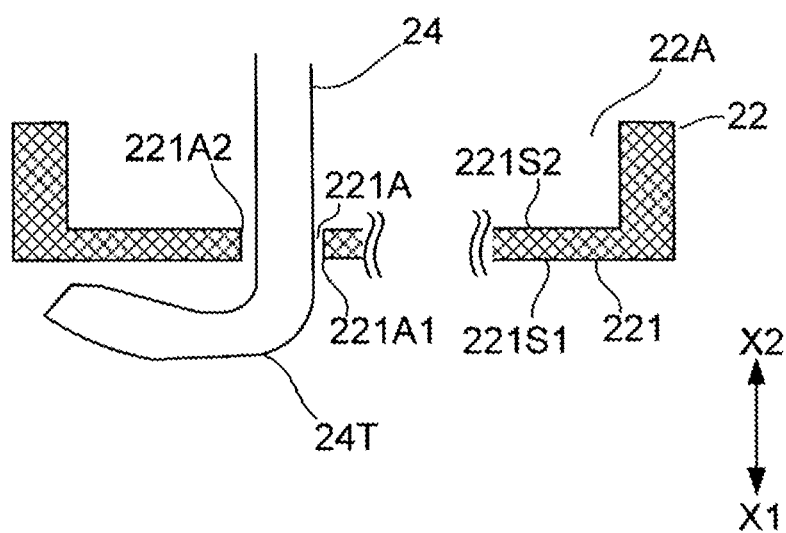
FIG. 6 is a view illustrating a step of bending a protruding portion of the conducting wire inserted into the through hole.

Next, a protruding portion 24T protruding from the opening portion 221A1 in the conducting wire 24 is bent as illustrated in FIG. 6. Accordingly, it is possible to suppress the conducting wire 24 from coming off from the through hole 221A.

Figure 7:
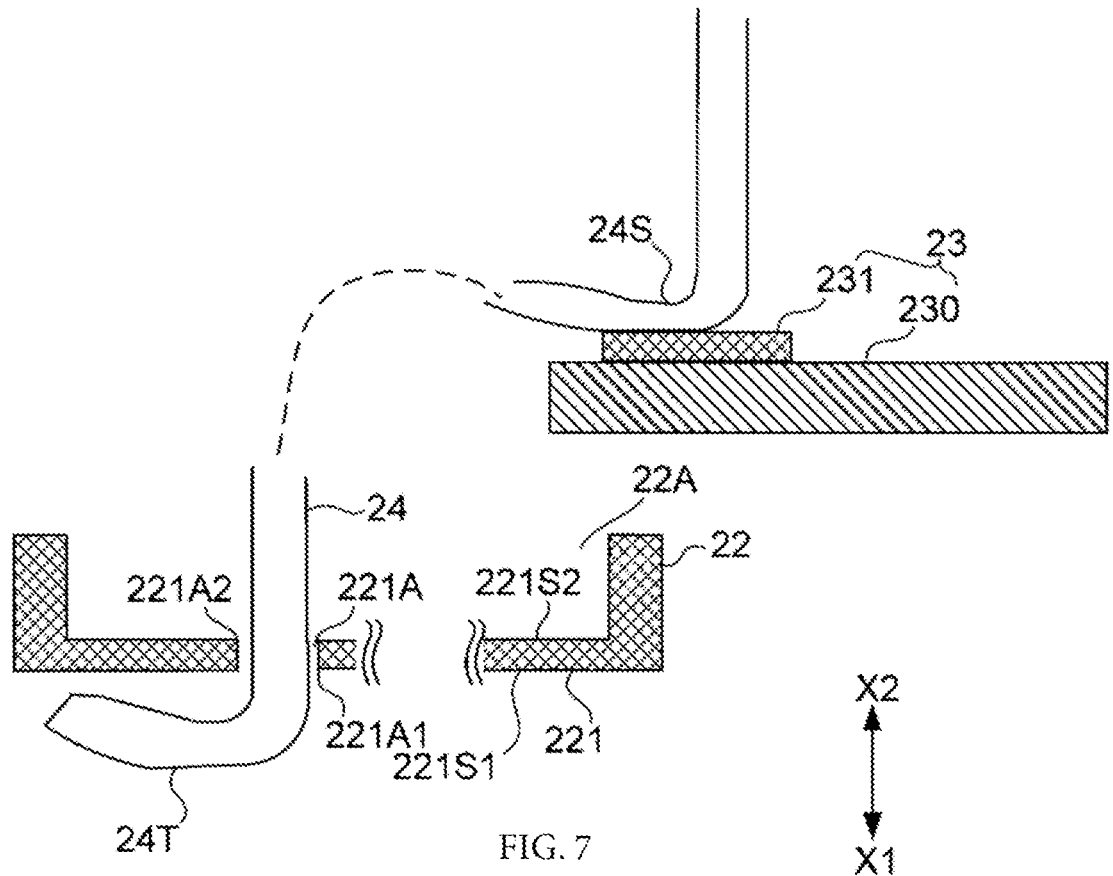
FIG. 7 is a view illustrating a step of bonding the conducting wire to a first electrode.
Figure 8:
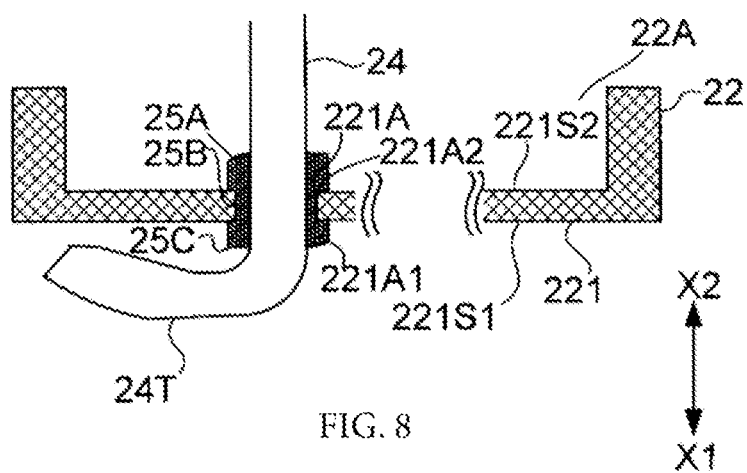
FIG. 8 is a view illustrating a step of disposing a curable resin in a recess and a through hole of an insulating member.

Then, as illustrated in FIG. 7, a step of bonding a bonding portion 24S located in the middle of the portion of the conducting wire 24 drawn out from the opening portion 221A2 to the first electrode 231 of the first board 23 is performed. Here, bonding is performed using a wire bonding technique. For example, ultrasonic vibration is applied to the bonding portion 24S while the bonding portion 24S is pressed against the first electrode 231. As a result, friction is generated on the contact surface between the bonding portion 24S and the first electrode 231, and the bonding portion 24S and the first electrode 231 are joined by frictional heat. At this time, the bonding portion 24S and the first electrode 231 are electrically connected.

Note that the first electrode 231 illustrated in FIG. 7 is a film-shaped pad protruding from the board portion 230 of the first board 23, but is not limited thereto, and may be a pad or the like disposed inside the board portion 230.

Thereafter, the side of the conducting wire 24 that is not on the through hole 221A side of the bonding place with the first electrode 231 is separated from the bonding place.

Then, a fixing member is poured into a place around the opening portion 221A2 in the recess 22A. As the fixing member, a thermosetting resin or a photocurable resin is used. The fixing member is in a liquid state before curing. The fixing member poured into the recess 22A flows into the gap between the through hole 221A and the conducting wire 24, and then reaches the one side surface 221S1 of the bottom portion 221. The fixing member of the recess 22A is cured by the supply of heat or light to become a first fixing member 25A (see FIG. 8). The fixing member in the gap between the through hole 221A and the conducting wire 24 is cured by the supply of heat or light to become a second fixing member 25B (see FIG. 8). The fixing member of the one side surface 221S1 is cured by the supply of heat or light to become a third fixing member 25C (see FIG. 8).

Figure 9:
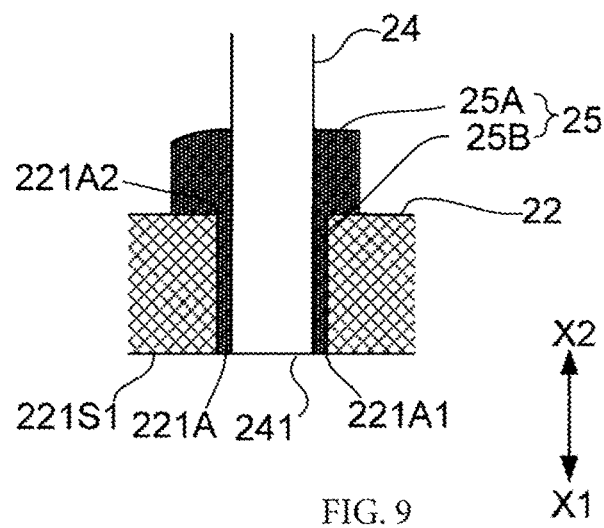
FIG. 9 is a view illustrating a step of polishing a cut surface of the conducting wire.

After the first fixing member 25A, the second fixing member 25B, and the third fixing member 25C are formed, a bent protruding portion 24T (see FIG. 8) of the conducting wire 24 is cut off by cutting processing. Then, the cut surface of the conducting wire 24 and the third fixing member 25C are polished. As a result, as illustrated in FIG. 9, an end surface 241 of the polished conducting wire 24 is flush with the one side surface 221S1 of the bottom portion 221. In the state illustrated in FIG. 9, the fixing member 25 is formed of the first fixing member 25A and the second fixing member 25B.

Although the third fixing member 25C is removed by polishing in the above description, the first fixing member 25A may be removed without removing the third fixing member 25C, or both the first fixing member 25A and the third fixing member 25C may be removed. In FIG. 9, both the first fixing portion 25A and the second fixing member 25B are provided, but one of the first fixing portion 25A and the second fixing member 25B may be removed.

Figure 10:
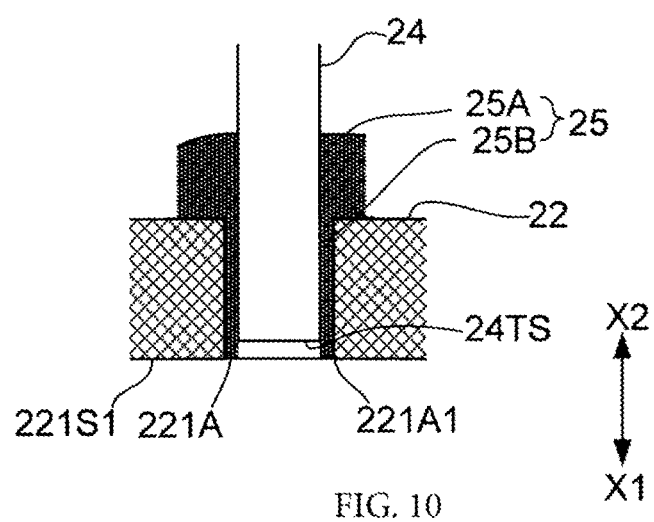
FIG. 10 is a view illustrating a step of performing etching processing on the conducting wire.

Next, as illustrated in FIG. 10, an end surface 24TS of the conducting wire 24 is positioned closer to the inside of the through hole 221A than the opening portion 221A1 by etching processing. Then, the end surface 24TS is plated with nickel to form a first metal layer. The tip of the first metal layer is located at a position protruding from the opening portion 221A1. Then, the tip of the first metal layer is polished to be flush with the one side surface 221S1.

Figure 11:
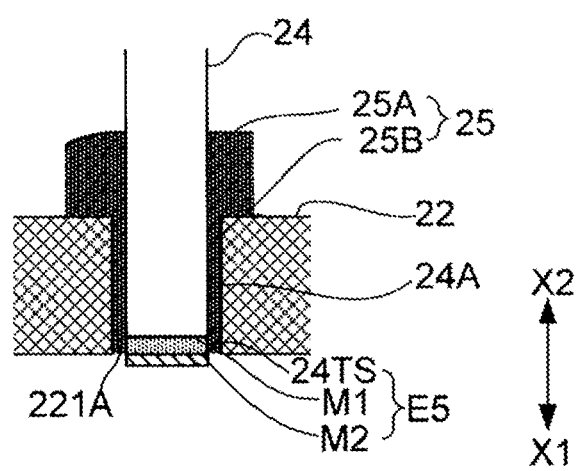
FIG. 11 is a view illustrating a step of performing plating processing on an end surface of the conducting wire.

Next, the first metal layer is plated with gold to form a second metal layer. As a result, as illustrated in FIG. 11, the one end portion 24A of the conducting wire 24 is disposed in the through hole 221A, and a first metal layer M1 and a second metal layer portion M2 are sequentially laminated on the one side X1 of the end surface 24TS of the one end portion 24A. The end surface 24TS, the first metal layer M1, and the second metal layer M2 constitute the fifth electrode E5. The other side end portion 11B of the contact terminal 11 is brought into contact with the second metal layer M2. That is, the contact terminal 11 is electrically connected to the end surface 24TS via the second metal layer M2 and the first metal layer M1. That is, the contact terminal 11 is electrically connected to the conducting wire 24.

The fifth electrode E5 may be constituted by the end surface 24TS and the first metal layer M1 without forming the second metal layer M2. Alternatively, the fifth electrode E5 may be constituted by the end surface 24TS and the second metal layer M2 without forming the first metal layer M1. Alternatively, the end surface 24TS may constitute the fifth electrode E5 without forming the first metal layer M1 and the second metal layer M2.

Alternatively, at least one of the first metal layer M1 and the second metal layer M2 may be formed on the end surface 241 (see FIG. 9) without performing etching processing. Alternatively, the first metal layer M1 and the second metal layer M2 may not be formed on the end surface 241 without performing etching processing. Alternatively, the protruding portion 24T may be cut in the state of FIG. 8, and the cut surface may be used as the fifth electrode E5 without being polished.

As described above, according to the present embodiment, when the arrangement position of the contact terminal 11 is determined, the through hole 221A is formed in the insulating member 22 in accordance with the position of the contact terminal 11, and the other end portion of the conducting wire 24 is connected to the first board 23 while one end portion of the conducting wire 24 is arranged in the through hole 221A. The first board 23 and the insulating member 22 can be prepared in advance. In addition, processing of the insulating member 22 only requires formation of the through hole 221A. Further, since the thickness of the bottom portion 221 of the insulating member 2 is thin by providing the recess 22A, the through hole 221A is easily formed. Therefore, the manufacturing period of the inspection jig 2 after the position of the inspection point 10A of the inspection target 10 and the arrangement position of the contact terminal 11 are fixed can be shortened. As described above, when the insulating member 22 in which the matrix-shaped through hole 221A is formed can be prepared in advance, the manufacturing period can be further shortened.

In particular, it is easy to automate the connection by using a wire bonding technique for the connection between the conducting wire 24 and the first electrode 231. The number of the conducting wires 24 may be several 1000, and in that case, it takes a very long work time to manually perform the connection by soldering, and the manufacturing efficiency can be greatly improved by automation of the connection.

As described above, the inspection device 5 according to the present embodiment includes the inspection jig 2 and the inspection processing portion 3 electrically connected to the first electrode 231. Thus, the manufacturing efficiency of the inspection jig used to electrically connect the inspection target 10 and the inspection processing portion 3 can be improved.

In addition, the inspection jig 2 includes a fixing member 25 that is disposed in at least one of the recess 22A and the through hole 221A and fixes a part of the conducting wire 24 to the insulating member 22. Accordingly, it is possible to suppress the conducting wire 24 from coming off from the insulating member 22.

The fixing member 25 contains a thermosetting resin or a photocurable resin. Since the thermosetting resin and the photocurable resin are liquid before being cured, the thermosetting resin and the photocurable resin are easily poured into the gap between the through hole 221A and the conducting wire 24. In addition, when the fixing member 25 is disposed in the recess 22A, it is possible to suppress leakage of liquid thermosetting resin or photocurable resin to the outside of the insulating member 22.

Note that the fixing member 25 is not limited to the above, and may include a thermoplastic resin or an adhesive. The fixing member 25 is not essential, and the conducting wire 24 may be fixed to the through hole 221A by press-fitting.

In addition, the end surface 24TS of the one end portion 24A of the conducting wire 24 is located inside the through hole 221A. The first metal layer M1 is provided on the end surface 24TS. The first metal layer M1 is formed of, for example, nickel, and has higher hardness than copper that is a conductor of the conducting wire 24 which is an enameled wire. That is, the first metal layer M1 has higher hardness than the conducting wire 24. Since the first metal layer M1 is formed by plating in the through hole 221A, it is easy to increase the thickness of the first metal layer M1. When the thickness of the first metal layer M1 having a higher hardness than the conducting wire 24 is increased, it is possible to prevent the first metal layer M1 from being worn and the conducting wire 24 from being exposed.

Further, the second metal layer M2 is connected to the first metal layer M1. As a result, since the surface of the first metal layer M1 is covered with the second metal layer M2, corrosion of the first metal layer M1 can be suppressed.

While the embodiments of the present disclosure have been described above, the embodiments can be modified in various ways within the scope of the present disclosure.

Various embodiments of the present disclosure are applicable to electrical inspections for various inspection targets.

Features of the above-described various embodiments and the modifications thereof may be combined appropriately as long as no conflict arises.

While various embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An inspection jig attachable to and detachable from an intermediate member electrically connected to a second board, the inspection jig comprising:
    a plate-shaped insulating member;
    a first board having a first electrode and a second electrode electrically connected to the first electrode;
    a conducting wire electrically connected to a contact terminal; and
    a plate-shaped accommodating member attached to the first board and having an accommodating portion penetrating in a thickness direction,
    wherein the second electrode is exposed through the accommodating portion,
    the accommodating portion is capable of accommodating the intermediate member,
    the insulating member is provided with a through hole penetrating in a thickness direction,
    one end portion of the conducting wire is disposed in the through hole, and
    the other end of the conducting wire is connected to the first electrode.

2. The inspection jig according to claim 1, further comprising
    a fixing member that is disposed in the through hole and fixes a part of the conducting wire to the insulating member.

3. The inspection jig according to claim 2, wherein the fixing member contains a thermosetting resin or a photocurable resin.

4. The inspection jig according to claim 3, wherein
an end surface of the one end portion of the conducting wire is located inside the through hole, and a first metal layer is provided on the end surface, and
the first metal layer has higher hardness than the conducting wire.

5. The inspection jig according to claim 3, wherein the conducting wire has an insulating film.

6. The inspection jig according to claim 2, wherein
an end surface of the one end portion of the conducting wire is located inside the through hole, and a first metal layer is provided on the end surface, and
the first metal layer has higher hardness than the conducting wire.

7. The inspection jig according to claim 2, wherein the conducting wire has an insulating film.

8. The inspection jig according to claim 1, wherein
an end surface of the one end portion of the conducting wire is located inside the through hole, and a first metal layer is provided on the end surface, and
the first metal layer has higher hardness than the conducting wire.

9. The inspection jig according to claim 8, wherein a second metal layer is connected to the first metal layer.

10. The inspection jig according to claim 8, wherein the conducting wire has an insulating film.

11. The inspection jig according to claim 1, wherein the conducting wire has an insulating film.

12. The inspection jig according to claim 1, wherein the first board has is disposed between the plate-shaped insulating member and the plate-shaped accommodating member.

13. The inspection jig according to claim 1, wherein a number of the first electrodes in the first board is larger than a number of the conducting wires.

14. The inspection jig according to claim 1, wherein
the insulating member has a first side facing away from the first board,
the first board is disposed on a side opposite the first side of the insulating member,
the first board has a board through hole penetrating in the thickness direction,
the conducting wire is disposed in the board through hole, and
the conducting wire extends radially inward from the first electrode to the board through hole in plan view viewed from one side.

15. The inspection jig according to claim 1, further comprising: a connection member extending in the thickness direction; and a second board, wherein a third electrode is disposed on one side surface of the second board, a fourth electrode is disposed on the other side surface of the second board, the third electrode and the fourth electrode are electrically connected, a pitch between the fourth electrodes is wider than a pitch between the third electrodes, one end portion of the connection member is in contact with the second electrode, and the other side end portion of the connection member is in contact with the third electrode.

16. The inspection jig according to claim 15, wherein the connection member includes a spring portion that can be compressed in the thickness direction.

17. The inspection jig according to claim 1, further comprising
a contact terminal electrically connected to the conducting wire.

18. An inspection device, comprising:
the inspection jig according to claim 1; and
an inspection processing portion electrically connected to the first electrode.

19. The inspection jig as claimed in claim 1, wherein the outer shape of the plate-shaped accommodating member is a rectangle.

20. The inspection jig as claimed in claim 1, wherein the plate-shaped accommodating member is configured to cover the first board.

* * * * *